United States Patent
Jiang et al.

(10) Patent No.: US 10,249,734 B2
(45) Date of Patent: Apr. 2, 2019

(54) POLY-SILICON THIN FILM TRANSISTOR AND MANUFACTURING METHOD THEREOF, ARRAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaohui Jiang, Beijing (CN); Jiaxiang Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/433,701

(22) PCT Filed: Aug. 21, 2014

(86) PCT No.: PCT/CN2014/084924
§ 371 (c)(1),
(2) Date: Apr. 6, 2015

(87) PCT Pub. No.: WO2015/161596
PCT Pub. Date: Oct. 29, 2015

(65) Prior Publication Data
US 2016/0254368 A1    Sep. 1, 2016

(30) Foreign Application Priority Data
Apr. 25, 2014  (CN) .......................... 2014 1 0171565

(51) Int. Cl.
*H01L 29/66*    (2006.01)
*H01L 21/28*    (2006.01)
(Continued)

(52) U.S. Cl.
CPC .. *H01L 29/66757* (2013.01); *H01L 21/28088* (2013.01); *H01L 27/1262* (2013.01);
(Continued)

(58) Field of Classification Search
CPC ................................................. H01L 29/66757
(Continued)

(56) References Cited

U.S. PATENT DOCUMENTS 6,362,027 B1 *  3/2002  Yamazaki ............... H01L 27/12
                                                    257/E21.413
2002/0001886 A1 *  1/2002  Ohtani ................. G02B 27/017
                                                    438/151
(Continued)

FOREIGN PATENT DOCUMENTS

CN      101013672 A    8/2007
CN      101022094 A    8/2007
(Continued)

OTHER PUBLICATIONS

International Search Report Appln. No, PCT/CN2014/084924; dated Jan. 6, 2015.
(Continued)

*Primary Examiner* — Hsin Yi Hsieh
(74) *Attorney, Agent, or Firm* — Ladas & Parry LLP; Loren K. Thompson

(57) ABSTRACT

A poly-silicon thin film transistor and its manufacturing method, an array substrate and its manufacturing method, and a display device are provided. The method for manufacturing a poly-silicon thin film transistor includes forming a poly-silicon layer on a base substrate so that the poly-
(Continued)

silicon layer includes a first poly-silicon area, second poly-silicon areas located at the both sides of the first poly-silicon area and third poly-silicon areas located at a side of the second poly-silicon areas away from the first poly-silicon area; forming a barrier layer between a gate electrode and a gate insulation layer by a dry etching method so that the barrier layer corresponds to the first poly-silicon area; and with the barrier layer as a mask doping the second poly-silicon areas to form lightly doped areas. By this method, the lightly doped areas may have the same length, and thus the problem of excessive leakage current is avoided.

12 Claims, 7 Drawing Sheets

(51) Int. Cl.
*H01L 27/12* (2006.01)
*H01L 29/49* (2006.01)
*H01L 29/78* (2006.01)
*H01L 29/786* (2006.01)

(52) U.S. Cl.
CPC .... *H01L 29/4966* (2013.01); *H01L 29/66492* (2013.01); *H01L 29/7833* (2013.01); *H01L 29/78621* (2013.01); *H01L 29/78675* (2013.01); *H01L 27/1288* (2013.01)

(58) Field of Classification Search
USPC ......................................................... 438/151
See application file for complete search history.

(56) References Cited

U.S. PATENT DOCUMENTS

| | | | |
|---|---|---|---|
| 2006/0091398 A1 | 5/2006 | Yamaguchi et al. | |
| 2006/0186476 A1 | 8/2006 | Suzuki | |
| 2006/0199337 A1* | 9/2006 | Chang | H01L 29/66757 438/264 |
| 2008/0121892 A1* | 5/2008 | Tseng | H01L 27/1214 257/72 |
| 2011/0272696 A1* | 11/2011 | Ryu | H01L 27/1225 257/59 |
| 2012/0240674 A1* | 9/2012 | Sakuma | G01F 1/6845 73/204.25 |
| 2015/0206905 A1 | 7/2015 | Wang | |

FOREIGN PATENT DOCUMENTS

| | | |
|---|---|---|
| CN | 103050410 A | 4/2013 |
| CN | 103151388 A | 6/2013 |
| CN | 103996716 A | 8/2014 |
| JP | 2006-156971 A | 6/2006 |

OTHER PUBLICATIONS

Written Opinion of the International Searching Authority Appln. No. PCT/CN2014/084924; dated Jan. 6, 2015.
First Chinese Office Action dated Apr. 6, 2016; Appln. No. 201410171565.6.

* cited by examiner

POLY-SILICON THIN FILM TRANSISTOR AND MANUFACTURING METHOD THEREOF, ARRAY SUBSTRATE AND MANUFACTURING METHOD THEREOF, AND DISPLAY DEVICE

TECHNICAL FIELD

At least one embodiment of the present invention relates to a poly-silicon thin film transistor and a manufacturing method thereof, an array substrate and a manufacturing method thereof, and a display device.

BACKGROUND

A low temperature poly-silicon thin film transistor (LTPS-TFT) display has advantages such as high resolution, quick response, high brightness, high aperture ratio, and so on. LTPS has high electron mobility due to its characteristics. In addition, peripheral driving circuits can be prepared on a glass substrate at the same time, realizing system integration, saving space and costs for driving ICs, and reducing the product defect rate.

Currently, the method for manufacturing a low temperature poly-silicon thin film field effect transistor includes the following steps:

S101, as shown in FIG. 1, forming a poly-silicon layer 20 on a base substrate 10. The poly-silicon layer 20 includes a first poly-silicon area 201, second poly-silicon areas located at the both sides of the first poly-silicon area 201, and third poly-silicon areas 203 located at a side of each second poly-silicon area 202 away from the first poly-silicon area 201.

S102, as shown in FIG. 2, subsequently forming a gate insulation layer 30, a gate metal film and a photoresist film on the base substrate on which the poly-silicon layer 20 has been formed, exposing and developing the photoresist film to obtain a photoresist fully retained portion 401, a photoresist half retained portion 402 and a photoresist fully removed portion. The photoresist fully retained portion 401 corresponds to the first poly-silicon area 201, the photoresist half retained portion 402 corresponds to the second poly-silicon areas 202, and the photoresist fully removed portion corresponds to the rest areas. The gate metal film on the photoresist fully removed portion is removed by a wet etching method, so as to obtain the gate metal film 50a corresponding to the photoresist fully retained portion 401 and the photoresist half retained portion 402.

S103, as shown in FIG. 3, with the photoresist fully retained portion 401 and the photoresist half retained portion 402 as a mask, performing N+ doping into the exposed third poly-silicon areas 203 to form heavily doped areas 203a.

S104, as shown in FIG. 4, removing the photoresist in the photoresist half retained portion 402 by an ashing process, and performing wet etching with respect to the exposed gate metal film to form a gate electrode 50.

S105, as shown in FIG. 5, with the gate electrode 50 as a mask, performing light doping into the exposed second poly-silicon areas 202 to form lightly doped areas 202a. In the case shown in FIG. 5, the first poly-silicon area 201, the lightly doped areas 202a, the heavily doped areas 203a construct an active layer 20a.

S106, as shown in FIG. 6, forming a protection layer 60 as well as a source electrode 701, a drain electrode 702, etc. on the base substrate on which the above steps have been completed.

SUMMARY

At least one embodiment of the present invention provides a poly-silicon thin film transistor and its manufacturing method, an array substrate and its manufacturing method, and a display device, by which the lightly doped areas located at the both sides of the first poly-silicon area can have the same length, the problem of excessive leakage current incurred by inconsistent lightly doped areas can be avoided.

In one aspect, at least one embodiment of the present invention provides a method for manufacturing a poly-silicon thin film transistor, the method includes: forming an active layer on a base substrate, and a gate insulation layer and a gate electrode above the active layer so that the active layer includes a first poly-silicon area, light doping areas located at the both sides of the poly-silicon area, and heavily doped areas located at a side of the lightly doped area away from the first poly-silicon area. Forming the lightly doped areas of the active layer includes: forming a poly-silicon layer on the base substrate so that the poly-silicon layer includes the first poly-silicon area, second poly-silicon areas located at the both sides of the first poly-silicon area, and third poly-silicon areas located at a side of the second poly-silicon areas away from the first poly-silicon area; forming a barrier layer between the gate electrode and the gate insulation layer by a dry etching method so that the barrier layer corresponds to the first poly-silicon area; and doping the second poly-silicon areas with the barrier layer covering the first poly-silicon area as a mask to form the lightly doped areas.

In another aspect, at least one embodiment of the present invention provides a method for manufacturing an array substrate, and the method includes forming a thin film transistor on a base substrate. The thin film transistor is made by using the above method for manufacturing a poly-silicon thin film transistor.

In still another aspect, at least one embodiment of the present invention provides a poly-silicon thin film transistor, the poly-silicon thin film transistor includes a base substrate, an active layer provided on the base substrate, and a gate insulation and a gate electrode provided above the active layer. The active layer includes a first poly-silicon area, lightly doped areas provided at the both sides of the first poly-silicon area, and heavily doped areas provided at a side of the lightly doped areas away from the first poly-silicon area. The poly-silicon thin film transistor further includes a barrier layer provided between the gate insulation layer and the gate electrode and corresponding to the first poly-silicon area.

In still another aspect, at least one embodiment of the present invention provides an array substrate including the above poly-silicon thin film transistor and a pixel electrode.

In still another aspect, at least one embodiment of the present invention provides a display device including the above poly-silicon thin film transistor or the above array substrate.

DESCRIPTION OF ACCOMPANYING DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE REFERENCE NUMERALS

Figure 1:
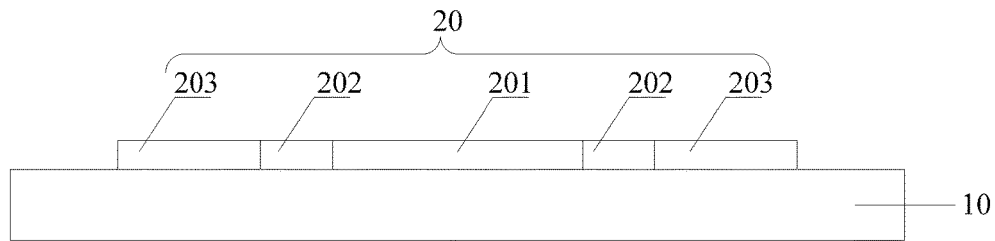
FIG. 1 to FIG. 6 are schematic diagrams showing the process for manufacturing a low temperature poly-silicon thin film transistor.
Figure 2:
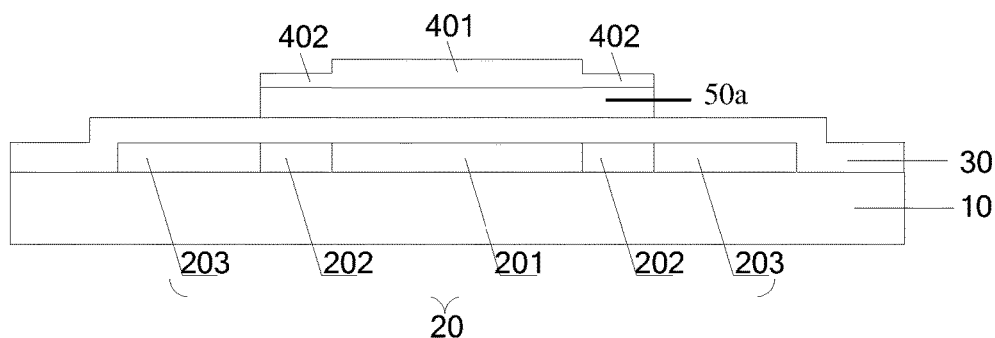
Figure 3:
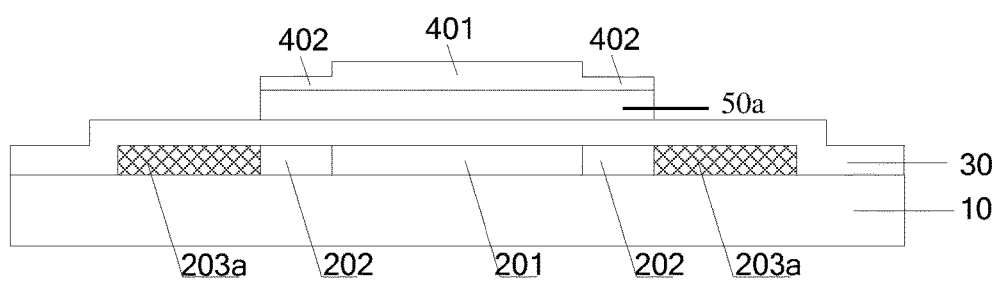
Figure 4:
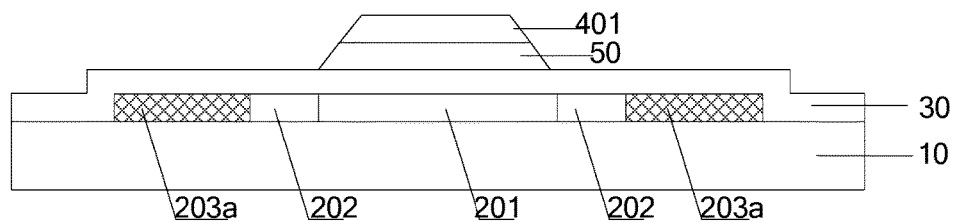
Figure 5:
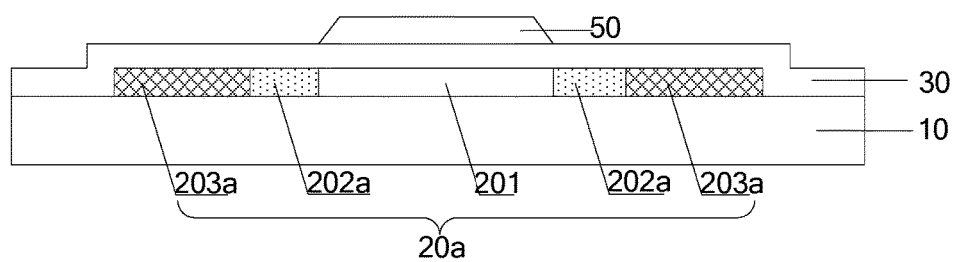
Figure 6:
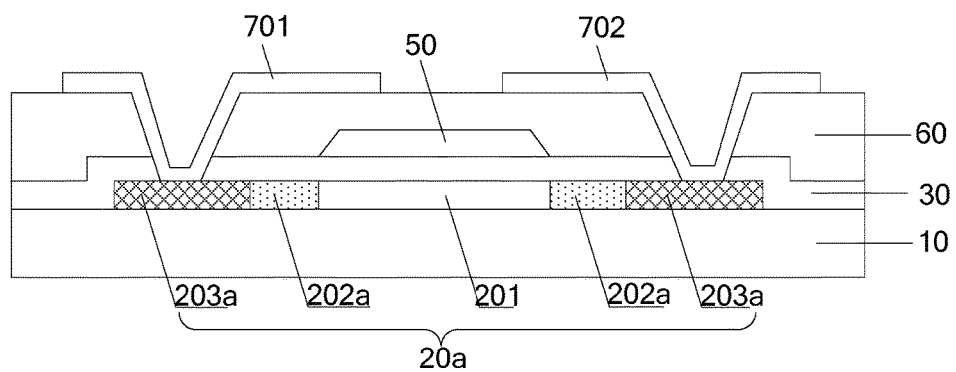

10—base substrate; 20—poly-silicon layer; 20a—active layer; 201—first poly-silicon area; 202—second poly-silicon area; 202a—lightly doped area; 203—third poly-silicon area; 30—gate insulation layer; 401—photoresist fully retained portion; 402—photoresist half retained portion; 403—first photoresist pattern; 50—gate electrode; 60—protection layer; 701—source electrode; 702—drain electrode; 80—barrier layer; 90—buffer layer; 100—planarization layer; 110—pixel electrode; 120—passivation layer; 130—common electrode.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The inventors of the present application have noted that in the manufacturing method as shown in FIG. 1 to FIG. 6, before performing lightly doping, it is necessary to remove the photoresist in the photoresist half retained portion 402 by an ashing process, and it is necessary to perform wet etching onto the exposed gate metal film. The wet etching and the ashing processes are both isotropic, and thus after forming the gate electrode 50 and performing the lightly doping with the gate electrode 50 as a mask, it is possible to cause the lightly doped areas located at the both sides of the first poly-silicon area 201 have different lengths, and thus it is possible to cause excessive leakage current, and hence influence the performance of the resultant thin film transistor.

At least one embodiment of the present invention provides a method for manufacturing a poly-silicon thin film transistor, the method includes: forming an active layer on a base substrate, and a gate insulation layer, a gate electrode, a source electrode and a drain electrode that are located above the active layer. The active layer includes a first poly-silicon area, lightly doped areas located at the both sides of the first poly-silicon area, heavily doped areas located at a side of the lightly doped areas away from the first poly-silicon area. The method further includes forming a barrier layer between the gate electrode and the gate insulation layer by a dry etching method so that the barrier layer corresponds to the first poly-silicon area.

In one embodiment, forming of the lightly doped areas of the active layer includes: forming a poly-silicon layer on the base substrate so that the poly-silicon layer includes a first poly-silicon area, second poly-silicon areas located at the both sides of the first poly-silicon area, and third poly-silicon areas located at a side of the second poly-silicon areas away from the first poly-silicon area; doping the second poly-silicon areas with the barrier layer covering the first poly-silicon area as a mask to form the lightly doped areas.

It is noted that firstly, the heavily doped area may be an N type heavily doped area, and in this case, for example, boron ions are doped. Of course, the heavily doped area may also be a P type heavily doped area, and in this case, for example, phosphorus ions are doped.

Secondly, in selecting the material for the barrier layer, selection ratio of it to an underlying material, e.g., the material of the gate insulation layer in the embodiment of the present invention, should be taken into consideration. That is to say, when the pattern of the barrier layer is formed by a dry etching method, it will not influence the underlying gate insulation layer. It is preferred to use the dry etching method because compared with a wet etching method, by a dry etching method, the side wall profile of the barrier layer can be well controlled, and thus the problem that the resultant lightly doped areas have inconsistent length caused by the laterally indentation of the side profile at both sides of the barrier layer can be avoided.

Thirdly, the barrier layer corresponding to the first poly-silicon area means that the barrier layer is fully overlapped with the poly-silicon area along the direction perpendicular to the base substrate.

Fourthly, there is no limitation on the sequence for forming the heavily doped areas, as long as the third poly-silicon areas can be formed into the heavily doped areas by the doping process.

Fifthly, the above doping process may be an ion injection process or diffusion process. Since the ion injection process has advantages such as being able to dope various kinds of impurities into different semiconductors at a relatively low temperature, precisely controlling the concentration distribution and injection depth of doped ions, achieving evenly doping over a large area, and so on; in one embodiment, the doping process is an ion injection process.

Sixthly, all the accompanying drawings in the present application only schematically depict the pattern layers related to the subject matter of the present invention, and will not show or only partially show the pattern layers unrelated with the subject matter of the present invention.

An embodiment of the present invention provides a method for manufacturing a poly-silicon thin film transistor, and the method includes forming an active layer on a base substrate and a gate insulation layer, a gate electrode, a source electrode and a drain electrode above the active layer. The active layer includes a first poly-silicon area, lightly doped areas located at the both sides of the first poly-silicon area, and heavily doped areas located at a side of the lightly doped areas away from the first poly-silicon area. The method further includes: forming a barrier layer corresponding to the first poly-silicon area between the gate electrode and the gate insulation layer. In one embodiment, forming the lightly doped areas of the active layer includes: forming a poly-silicon layer on the base substrate, wherein the poly-silicon layer includes a first poly-silicon area, second poly-silicon areas located at the both sides of the first poly-silicon area, third poly-silicon areas located at a side of the second poly-silicon areas away from the first poly-silicon area; doping the second poly-silicon areas with the barrier layer covering the first poly-silicon area as a mask to form the lightly doped areas.

In the embodiment of the present invention, since the barrier layer corresponding to the first poly-silicon area is formed by a dry etching method, and by the dry etching method, the side wall profile of the barrier layer can be well controlled, that is to say, the side walls at both sides of the barrier layer can be controlled to be perpendicular to the base substrate; in this way, after doping the second poly-silicon areas with the barrier layer as a mask, the resultant lightly doped areas can have the same length, and thus the problem of excessive leakage current incurred by inconsistent lengths of the lightly doped areas can be avoided, and hence the influence on the performance of the thin film transistor can be avoided.

Considering the material for the gate insulation layer is generally silicon nitride, silicon oxide, or the like, in order to avoid influencing the gate insulation layer and even the poly-silicon layer upon forming the barrier layer, in a different embodiment, the material for the barrier layer may be an oxide, e.g., a metal oxide, such as $Al_2O_3$, or non-metal oxide, such as $SiO_2$, and so on.

In one embodiment, forming of the heavily doped areas can be performed by doping the third poly-silicon areas with a film layer covering the first poly-silicon area and the second poly-silicon area as a mask before the lightly doped areas are formed.

It is noted that the film layer covering the first poly-silicon area and the second poly-silicon areas will not be limited herein, it can be a photoresist film layer separately formed above the gate insulation layer, or it can also be a photoresist film layer located on a gate metal film during the gate electrode is formed, there is no limitation herein.

Thereby, forming of the heavily doped areas, e.g., can be performed by the following method, that is, on the base substrate on which the poly-silicon layer and the gate insulation layer have been formed, a first photoresist pattern is formed to cover the first poly-silicon area and the second poly-silicon areas, and with the first photoresist pattern as a mask, the third poly-silicon areas are doped to form the heavily doped areas.

Base on the above, in an embodiment, the barrier layer corresponding to the first poly-silicon area can be formed on the gate insulation layer by a dry etching method, and with the barrier layer as a mask, the second poly-silicon areas are doped to form the lightly doped areas.

In a different embodiment, doping of the second poly-silicon areas can be performed after the barrier layer is formed and before the gate electrode located above the barrier layer is formed, or may also be formed after the gate electrode located above the barrier layer is formed.

Figure 7:
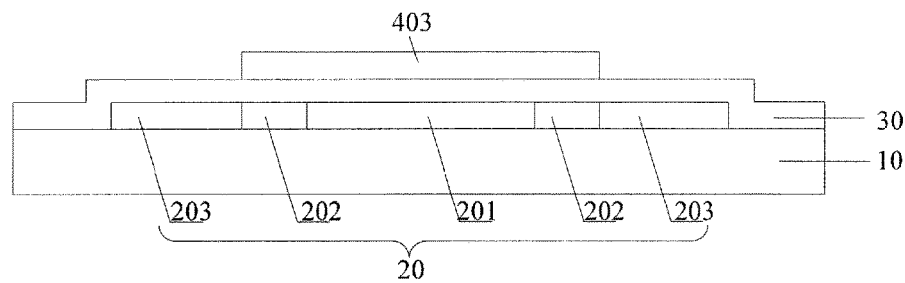
FIG. 7 to FIG. 11 are schematic diagrams showing the process for manufacturing a poly-silicon thin film transistor as provided by an embodiment of the present invention.

Based on the above embodiment, forming of the poly-silicon thin film transistor, for example, can be achieved by the steps as follows:

S201, depositing a silicon film on the base substrate 10, performing a process of poly-crystallization to form a poly-silicon film, and by a patterning process, to form the poly-silicon layer 20, as shown in FIG. 7.

In one embodiment, the poly-silicon layer 20 includes the first poly-silicon area 201, the second poly-silicon areas 202 located at the both sides of the first poly-silicon area 201, and the third poly-silicon areas 203 located at a side of the second poly-silicon areas away from the first poly-silicon area 201.

In one embodiment, forming of the poly-silicon film may include: depositing a layer of amorphous silicon film on the base substrate 10 by plasma enhanced chemical vapor deposition (PECVD). For example, the amorphous silicon film is subjected to a dehydrogenation process by using a high temperature oven to prevent a hydrogen exploration phenomenon during the crystallization process and to prevent the defect state density inside the film after the crystallization from reducing. After the dehydrogenation process is completed, a low temperature poly-silicon (LTPS) process is performed, for example, the amorphous silicon film is subjected to a crystallization process with an excimer laser annealing (ELA) process, a metal-induced crystallization (MIC) process or a solid phase crystallization (SPC) process, and so on, to form the poly-silicon film on the base substrate. The thickness of the poly-silicon film may be e.g., 300 Å~500 Å.

S202, as shown in FIG. 7, on the basis of the step S201, forming the gate insulation layer 30, and forming the first photoresist pattern 403 covering the first poly-silicon area 201 and the second poly-silicon areas 202 on the gate insulation layer 30.

Considering that the thickness of the gate insulation 30 will influence the energy required for ion injection in the subsequent process, in the present step, the thickness of the gate insulation layer 30 may be 700 Å·1100 Å.

For example, the gate insulation layer 30 may include SiO2 with a thickness of 400 Å~600 Å and SiNx with a thickness of 300 Å~500 Å on it.

Figure 8:
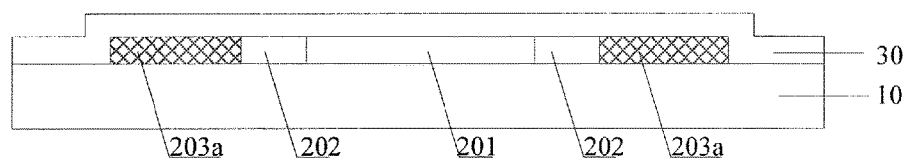

S203, as shown in FIG. 8, on the basis of step 202, with the first photoresist pattern 403 as a mask, doping the third poly-silicon areas 203, to form the heavily doped areas 203a, and removing the first photoresist pattern 403.

In one embodiment, the heavily doped areas 203a may be an N-type, and the doped ions e.g., are boron ions.

Figure 9:
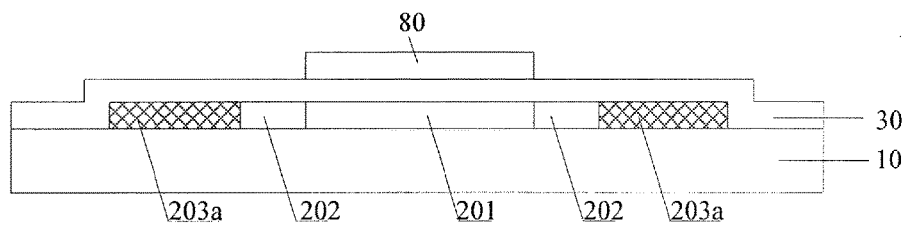

S204, on the basis of step S203, sequentially forming a barrier layer film and a photoresist film, exposing and developing the photoresist film formed on the base substrate by using a normal mask plate to form a photoresist fully retained portion and a photoresist fully removed portion. The photoresist fully retained portion corresponds to the first poly-silicon area 201, and the photoresist fully removed portion corresponds to the remaining portion. The barrier layer film in the photoresist fully removed portion is removed by a dry etching method, to form the barrier layer 80 corresponding to the first poly-silicon area 201, as shown in FIG. 9.

The material for the barrier layer 80 for example is $SiO_2$, and the thickness thereof is 200 Å~400 Å.

Figure 10:
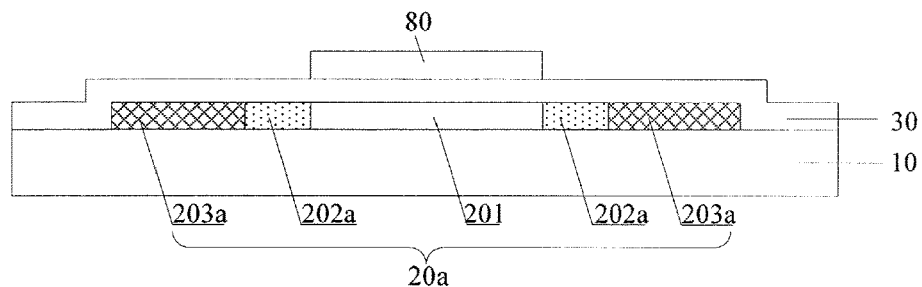

S205, as shown in FIG. 10, on the basis of the step S204, doping the second poly-silicon areas 202 with the barrier layer 80 as a mask to form the lightly doped areas 202a. Here, by forming the lightly doped areas 202a, the leakage current can be suppressed. The first poly-silicon area 201, the lightly doped areas 202a, and the heavily doped areas 203a form the active layer 20a.

Figure 11:
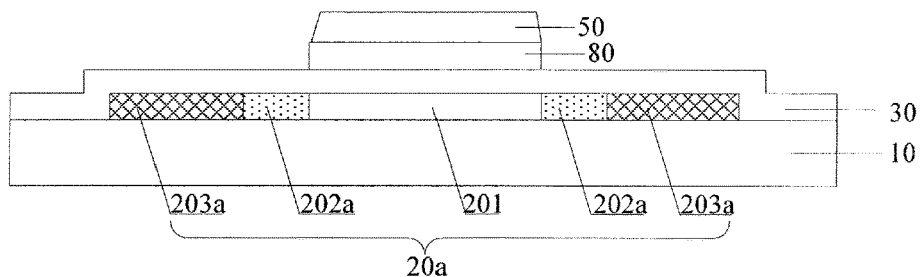

S206, as shown in FIG. 11, on the basis of the step S205, forming the gate electrode 50. The material for the gate electrode 50 for example may be Mo, AL/Mo, Cu, and so on, and the thickness thereof may be 2200 Å~3400 Å.

Figure 12:
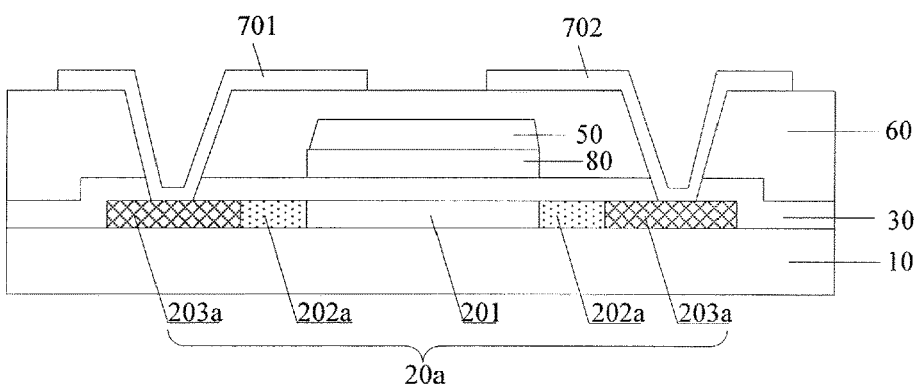
FIG. 12 is a schematic diagram showing the structure of a poly-silicon thin film transistor as provided by an embodiments of the present invention.

S207, as shown in FIG. 12, on the basis of the step S206, forming the protection layer 60 as well as the source electrode 701 and the drain electrode 702. The source electrode 701 and the drain electrode 702 contact the heavily doped areas 203a through via holes formed in the protection layer 60 and the gate insulation layer 30.

The protection layer 60 for example may include $SiO_2$ having the thickness of 1500 Å~2500 Å and SiNx having the thickness of 2500 Å~3500 Å.

The material for the source electrode 701 and the drain electrode 702 for example may be Mo, Mo/Al/Mo, Cu, and so on, and the thickness thereof may be 2200 Å~3800 Å.

Of course, after the above steps S201 to S204 and before the step S207, the lightly doped areas 202a and the gate electrode 50 may also be formed according to the steps as follows:

S208, on the basis of the step S204, forming the gate electrode 50 on the barrier layer 80.

S209, on the basis of the step S208, with the barrier layer 80 as a mask, doping the second poly-silicon areas 202 to form the lightly doped areas 202a.

Figure 13:
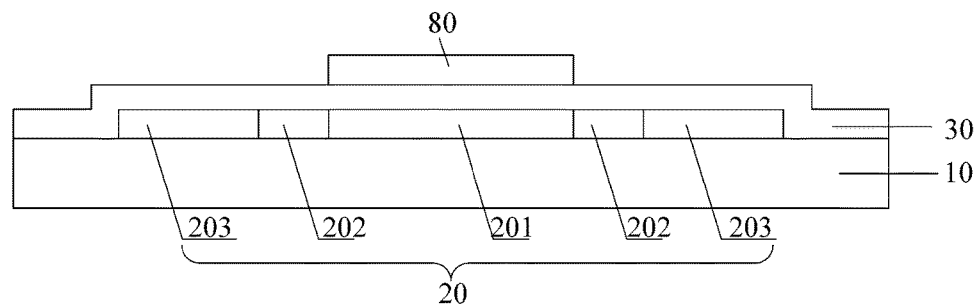
FIG. 13 to FIG. 16 are schematic diagrams showing another process for manufacturing a poly-silicon thin film transistor as provided by an embodiment of the present invention.

In one embodiment, forming of the above mentioned poly-silicon thin film transistor for example may be conducted by the steps as follows:

S301, as shown in FIG. 13, on the basis of the step S201, forming the gate insulation layer 30.

S302, on the basis of the step S301, sequentially forming the barrier layer and a photoresist film, exposing the photoresist film formed on the base substrate by using a normal mask plate to form the photoresist fully retained portion and the photoresist fully removed portion after development. The photoresist fully retained portion corresponds to the first poly-silicon area 201, and the photoresist fully removed portion corresponds to the remaining portion. The barrier layer film in the photoresist fully removed portion is removed by a dry etching method, to form the barrier layer 80 corresponding to the first poly-silicon area 201, as shown in FIG. 13.

Figure 14:
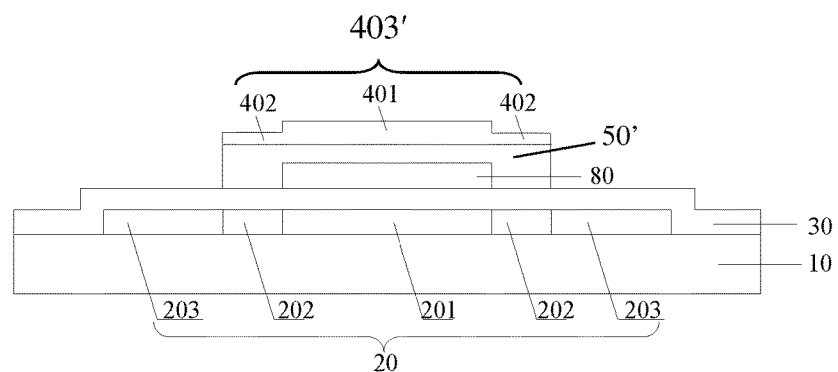

S303, as shown in FIG. 14, on the basis of the step S302, sequentially forming the gate metal film and a photoresist film, exposing the photoresist film formed on the base substrate by using a half tone mask or a grey tone mask, to form the photoresist fully retained portion 401, the photoresist fully removed portion and a photoresist half retained portion 402 after development. The photoresist fully retained portion 401 corresponds to the first poly-silicon area 201, and the photoresist half retained portion 402 corresponds to the second poly-silicon areas 202. The photoresist fully retained portion 401 and the photoresist half retained portion 402 constitute a second photoresist pattern 403', and the gate metal film located below the second photoresist pattern 403' constitutes a gate metal pattern 50'.

Figure 15:
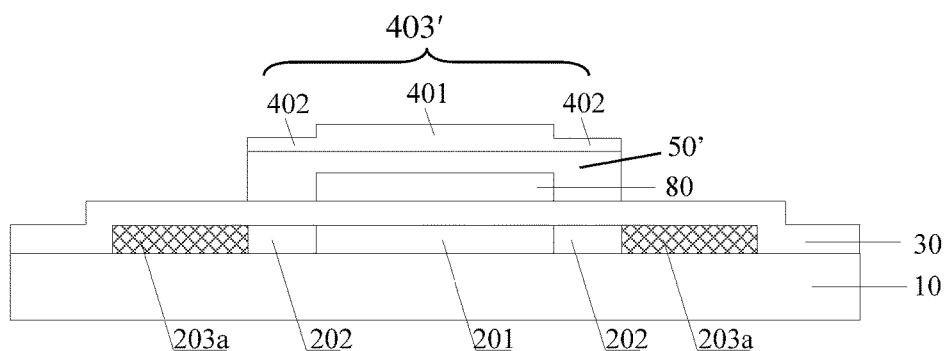

S304, as shown in FIG. 15, on the basis of the step 303, with the second photoresist pattern as a mask, doping the third poly-silicon areas 203 to form the heavily doped areas 203a.

Figure 16:
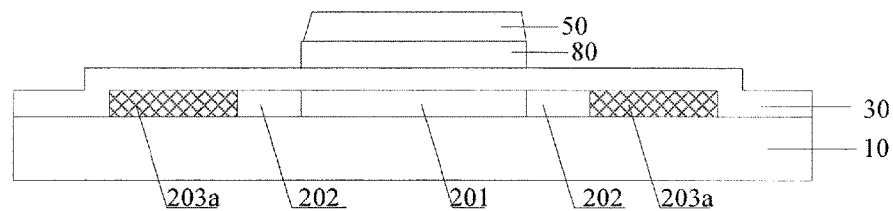

S305, as shown in FIG. 16, on the basis of the step S304, removing the photoresist in the photoresist half retained portion 402 by an ashing process and removing the exposed gate metal film by a wet etching process, to form the gate electrode 50.

S306, referring to FIG. 11, on the basis of the step S305, with the barrier layer 80 below the gate electrode 50 as a mask, doping the second poly-silicon areas 202 to form the lightly doped areas 202a. The first poly-silicon area 201, the lightly doped areas 202a and the heavily doped areas 203a constitute the active layer 20a. Herein, the photoresist fully retained portion 401 on the gate electrode 50 may be removed after the lightly doped areas 202a has been formed.

S307, referring to FIG. 12, on the basis of the step S306, forming the protection layer 60 as well as the source electrode 701 and the drain electrode 702. The source electrode 701 and the drain electrode 702 contact with the heavily doped areas 203a through via holes formed in the protection layer 60 and the gate insulation layer 30.

Figure 17:
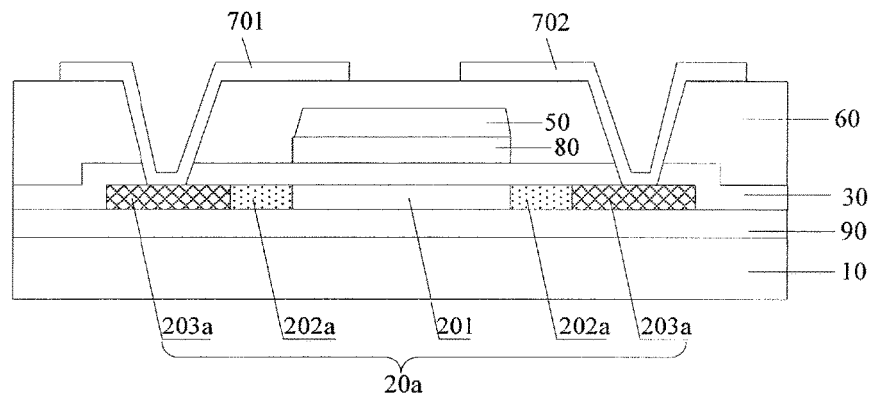
FIG. 17 is another schematic diagram showing the structure of the poly-silicon thin film transistor provided by an embodiment of the present invention.

Based on the above, considering the glass base substrate may include damaging impurities, such as alkali metal ions, which will influence the performance of the poly-silicon layer, and therefore, as shown in FIG. 17, in one embodiment of the present invention, before forming the poly-silicon layer 20, a buffer layer 90 is formed on the base substrate 10.

Figure 18:
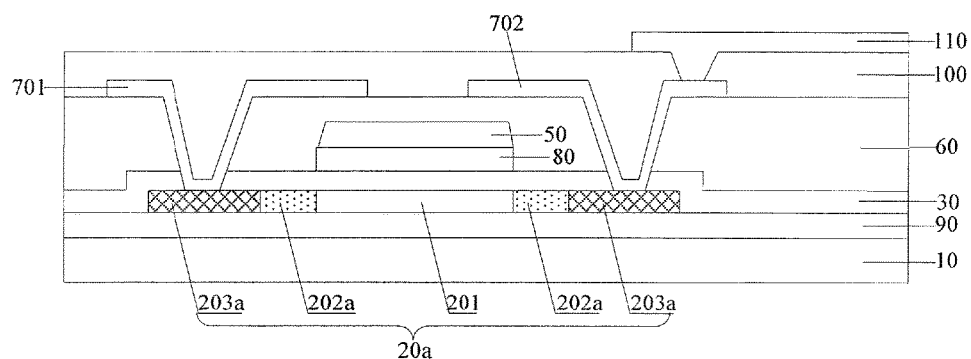
FIG. 18 is a schematic diagram showing the structure of an array substrate as provided by an embodiment of the present invention.

At least one embodiment of the present invention further provides a method for manufacturing an array substrate, and the method includes forming a poly-silicon thin film transistor. The poly-silicon thin film transistor may be formed by any method provided by any one of the above embodiments. Thereby, the method may include the steps as follows:

S401, as shown in FIG. 18, on the basis of the step S207 or S307, forming a planarization layer 100, and forming a pixel electrode 110 electrically connected with the drain electrode 702 on the planarization layer 100.

In a different embodiment, the material for the planarization layer 100 for example may be a photosensitive resin material or non-photosensitive resin material and may have a thickness of 1.5 μm to 5 μm. In addition, the planarization layer 100 may also reduce the parasite capacitance between the pixel electrode 110 and the source/drain electrode.

The material for the pixel electrode 110 may be ITO and may have a thickness of 400 Å~700 Å.

Figure 19:
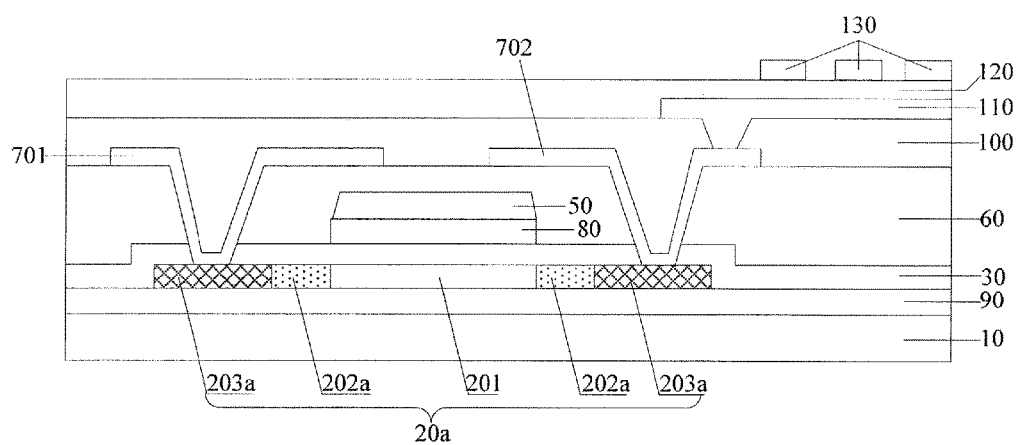
FIG. 19 is another schematic diagram showing the structure of an array substrate as provided by an embodiment of the present invention.

Based on above, the method further includes:

S402, as shown in FIG. 19, on the basis of the above step S401, forming a passivation layer 120, and forming a common electrode 130 on the passivation layer 120.

An embodiment of the present invention provides a poly-silicon thin film transistor, as shown in FIG. 12. The poly-silicon thin film transistor includes a base substrate 10, an active layer 20a provided on the base substrate 10, a gate insulation layer 30 and a gate electrode 50 provided above the active layer 20a, and a source electrode 701 and a drain electrode 702 provided above the gate electrode 50. The active layer 20a includes a first poly-silicon area 201, lightly doped areas 202a provided at the both sides of the first poly-silicon area, and heavily doped area 203a provided at a side of the lightly doped areas away from the first poly-silicon area. In one embodiment, the poly-silicon thin film transistor further includes a barrier layer 80 provided between the gate insulation layer 30 and the gate electrode 50 and corresponding to the first poly-silicon area 201.

It is noted that firstly, the heavily doped area may be an N type heavily doped area, and in this case, for example, boron ions are doped.

Secondly, when selecting the material for the barrier layer 80, it is necessary to consider the selection ratio of it to an underlying material, for example, the material for the gate insulation layer 30 in the embodiment of the present invention, that is, when forming the pattern for the barrier layer 80 by a dry etching method, no impact will be invoked with respect to for example the underlying gate insulation layer 30.

An embodiment of the present invention provides a poly-silicon thin film transistor comprising a base substrate 10, an active layer 20a provided on the base substrate 10, a gate insulation layer 30 and a gate electrode 50 provided above the active layer 20a, and a source electrode 701 and a drain electrode 702 provided above the gate electrode 50. The active layer 20a includes a first poly-silicon area 201, lightly doped areas 202a provided at the both sides of the first poly-silicon area, and heavily doped areas 203a provided at a side of the lightly doped areas away from the first poly-silicon area. In an embodiment, the poly-silicon thin film transistor further includes a barrier layer 80 provided between the gate insulation layer 30 and the gate electrode 50 and corresponding to the first poly-silicon area 201.

Since the barrier layer 80 corresponding to the first poly-silicon area 201 is formed by a dry etching method, by which the sidewall profile of the barrier layer 80 can be well controlled, that is, the sidewalls at both sides of the barrier layer 80 can be controlled to be perpendicular to the base substrate 10; in this way, after the second poly-silicon areas 202 are doped with the barrier layer 80 as a mask, the resultant lightly doped areas 202a may have the same length, thus the problem of excessive leakage current incurred due to inconsistent lengths of the lightly doped areas 202a can be avoided, and thus the influence on the performance of the thin film transistor can also be avoided.

Considering that the gate insulation layer generally employs the material such as silicon nitride, silicon oxide, and so on, in order to avoid influence on the gate insulation layer and even the poly-silicon layer when forming the barrier layer, in a different embodiment, the material for the barrier layer may be an oxide, for example, metal oxide, such as $Al_2O_3$, or non-metal oxide, such as $SiO_2$, and so on.

In one embodiment, the barrier layer 80 may have a thickness of 200 Å~400 Å.

In one embodiment, considering the glass base substrate may include damaging impurities, such as alkali metal ions, which will influence the performance of the poly-silicon layer, and therefore, as shown in FIG. 17, in an embodiment of the present invention, the thin film transistor may further include a buffer layer 90 provided on the upper surface of the base substrate 10.

At least one embodiment of the present invention provides an array substrate, as shown in FIG. 18, the array substrate includes the above described poly-silicon thin film transistor and a pixel electrode 110. Of course, the array substrate further includes gate lines, data lines, and so on, and will not further described in detail.

Thereby, as shown in FIG. 19, the array substrate may also include a common electrode 130. For example, for an In-Plane Switch (IPS) array substrate, the pixel electrode 110 and the common electrode 130 are provided in the same layer at an interval, and both are stripe electrodes. For example, for an Advanced-super Dimensional Switching (ADS) array substrate, as shown in FIG. 19, the pixel electrode 110 and the common electrode 130 are provided at different layers, for example, the upper electrode is a stripe electrode and the lower electrode is a plate electrode.

Of course, the array substrate provided by an embodiment of the present invention is also suitable for an OLED display, it will not further described in detail.

At least one embodiment of the present invention also provides a display device comprising the poly-silicon thin film transistor as described in any one of the above embodiments or the array substrate as described in any one of the above embodiments. The display device may be any product or component having display function, such as mobile phone, tablet computer, television, monitor, laptop computer, digital photo frame, navigator, and so on. The implementation of the display device may be done with reference to the above poly-silicon thin film transistor embodiments and the above array substrate embodiments, and will not further described in any detail.

What has been described above is only the specific embodiment of the present invention, and the protection scope of the present invention will not be limited thereto. It is apparent to the person skilled in the art that various of modification and variation can be made to the present invention within the scope disclosed by the present invention, and the modification and variation should fall within the protection scope of the present invention. Thus, the protection scope of the present invention is defined only by the claims.

The present application claims the priority of Chinese Patent Application No. 201410171565.6 filed on Apr. 25, 2014, the Chinese Patent Application is entirely incorporated herein as a part of the present application by reference.

What is claimed is:

1. A method for manufacturing a poly-silicon thin film transistor comprising: forming an active layer on a base substrate, and a gate insulation layer and a gate electrode above the active layer, the active layer including a first poly-silicon area, lightly doped areas located at both sides of the first poly-silicon area, and heavily doped areas located at a side of the lightly doped areas away from the first poly-silicon area, wherein forming of the lightly doped areas of the active layer includes:

forming a poly-silicon layer on the base substrate, the poly-silicon layer including the first poly-silicon area, second poly-silicon areas located at both sides of the first poly-silicon area, and third poly-silicon areas located at a side of the second poly-silicon areas away from the first poly-silicon area;

with a film layer covering the first poly-silicon area and the second poly-silicon areas as a mask, the third poly-silicon areas are doped to form the heavily doped areas;

forming a barrier layer between the gate electrode and the gate insulation layer by a dry etching method so that the barrier layer corresponds to the first poly-silicon area; and after doping the third poly-silicon areas with the film layer covering the first poly-silicon area and the second poly-silicon areas as the mask, doping the second poly-silicon areas with the barrier layer covering the first poly-silicon area as a mask, to form the lightly doped areas, wherein the barrier layer is a layer which serves as the mask for doping and which has an orthographic projection on the poly-silicon layer coinciding with the first poly-silicon area, and the dry etching method for directly forming the barrier layer is before etching for directly forming the gate electrode.

2. The method according to claim 1, wherein:

on the base substrate on which the poly-silicon layer and the gate insulation layer have been formed, a first photoresist pattern covering the first poly-silicon area and the second poly-silicon areas are formed, and with the first photoresist pattern as a mask, the third poly-silicon areas are doped to form the heavily doped areas.

3. The method according to claim 1, wherein:

on the base substrate on which the poly-silicon layer, the gate insulation layer and the barrier layer have been formed, a gate metal pattern covering the first poly-silicon area and the second poly-silicon areas and a second photoresist pattern located above the gate metal pattern are formed, and with the second photoresist pattern as a mask, the third poly-silicon areas are doped to form the heavily doped areas;

the second photoresist pattern includes a photoresist fully retained portion corresponding to the first poly-silicon area and a photoresist half retained portion corresponding to the second poly-silicon areas.

4. The method according to claim 3, wherein:

after forming the heavily doped areas, the photoresist in the photoresist half retained portion is removed by an ashing process, and the gate electrode is formed by a wet etching method; and with the barrier layer located below the gate electrode, the second poly-silicon areas are doped to form the lightly doped areas.

5. The method according to claim 1, wherein a material for the barrier layer includes an oxide.

6. The method according to claim 5, wherein the oxide includes a metal oxide and a non-metal oxide.

7. The method according to claim 1, further including: forming a buffer layer on the base substrate before forming the poly-silicon layer.

8. A method for manufacturing an array substrate comprising forming a thin film transistor on a base substrate, wherein the thin film transistor is made by the method according to claim 1.

9. The method according to claim 3, further including: forming a buffer layer on the base substrate before forming the poly-silicon layer.

10. The method according to claim 5, further including: forming a buffer layer on the base substrate before forming the poly-silicon layer.

11. A method for manufacturing a poly-silicon thin film transistor comprising: forming an active layer on a base substrate, and a gate insulation layer and a gate electrode above the active layer, the active layer including a first poly-silicon area, lightly doped areas located at both sides of the first poly-silicon area, and heavily doped areas located at a side of the lightly doped areas away from the first poly-silicon area, wherein forming of the lightly doped areas of the active layer includes:

forming a poly-silicon layer on the base substrate, the poly-silicon layer including the first poly-silicon area, second poly-silicon areas located at both sides of the first poly-silicon area, and third poly-silicon areas located at a side of the second poly-silicon areas away from the first poly-silicon area;

forming a barrier layer between the gate electrode and the gate insulation layer by a dry etching method so that the barrier layer corresponds to the first poly-silicon area, wherein the barrier layer is a layer which serves as a mask for doping and which has an orthographic projection on the poly-silicon layer coinciding with the first poly-silicon area, and the dry etching method for directly forming the barrier layer is before a wet etching method for directly forming the gate electrode; and doping the second poly-silicon areas with the barrier layer covering the first poly-silicon area as a mask, to form the lightly doped areas.

12. The method according to claim 1, wherein:

an upper surface of the first poly-silicon area, upper surfaces of the lightly doped areas and upper surfaces of the heavily doped areas are in a same planar surface.

* * * * *